(12) United States Patent
Janta-Polczynski et al.

(10) Patent No.: US 11,209,598 B2
(45) Date of Patent: Dec. 28, 2021

(54) PHOTONICS PACKAGE WITH FACE-TO-FACE BONDING

(71) Applicant: INTERNATIONAL BUSINESS MACHINES CORPORATION, Armonk, NY (US)

(72) Inventors: Barnim Alexander Janta-Polczynski, Shefford (CA); Isabel De Sousa, Chambly (CA); Jean Audet, Granby (CA); Maryse Cournoyer, Granby (CA); Sylvain Pharand, St-Bruno de Montarville (CA); Roxan Lemire, Granby (CA); Louis-Marie Achard, Granby (CA); Paul Francis Fortier, Richelieu (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/288,946

(22) Filed: Feb. 28, 2019

(65) Prior Publication Data
US 2020/0279840 A1    Sep. 3, 2020

(51) Int. Cl.
    *G02B 6/30*    (2006.01)
(52) U.S. Cl.
    CPC ..................... *G02B 6/30* (2013.01)
(58) Field of Classification Search
    CPC ........... G02B 6/26; G02B 6/30; H01L 23/538; H01L 23/5381; H01L 23/5385; H01L 23/13; H01L 24/81; H01L 2924/14; H01L 2924/1433; H01L 2924/1434
    USPC ................................ 385/49, 88, 89; 257/777
    See application file for complete search history.

(56) References Cited

U.S. PATENT DOCUMENTS

| | | | | | |
|---|---|---|---|---|---|
| 4,178,069 | A | * | 12/1979 | Andersen | G02B 6/4484 385/104 |
| 5,351,329 | A | * | 9/1994 | Moore | G02B 6/4202 385/92 |
| 5,694,506 | A | * | 12/1997 | Kobayashi | G02B 6/30 385/60 |

(Continued)

FOREIGN PATENT DOCUMENTS

| | | | | |
|---|---|---|---|---|
| GB | 2381084 | * | 4/2003 | G02B 6/42 |
| JP | 2006523428 A | | 10/2006 | |

(Continued)

OTHER PUBLICATIONS

"Predicted Curvatures and Stresses in a Fiber-optic Interconnect Subjected to Bending" by Suhir, Journal of Lightwave Technology, vol. 14, No. 2, pp. 144-147 (Year: 1996).*

*Primary Examiner* — Robert Tavlykaev
(74) *Attorney, Agent, or Firm* — Cantor Colburn LLP; Peter Wang (57) ABSTRACT

A photonic package is provided. The photonic package includes a base substrate defining an aperture, a top die and a photonic integrated circuit (PIC) die. The top die includes a body with first and second top die sections. The first top die section is connectable with the base substrate. The PIC die includes body with first and second PIC die sections. The PIC die is disposable in the aperture such that the second PIC die section is connectable with the second top die section and the first PIC die section extends beyond the second top die section and is exposed for connection to a waveguide assembly.

19 Claims, 5 Drawing Sheets

(56) References Cited

U.S. PATENT DOCUMENTS

| | | | |
|---|---|---|---|
| 5,955,010 A * | 9/1999 | Okada | G02B 6/2552 |
| | | | 264/1.25 |
| 6,057,598 A | 5/2000 | Payne et al. | |
| 6,075,914 A * | 6/2000 | Yeandle | G02B 6/30 |
| | | | 385/49 |
| 6,175,158 B1 | 1/2001 | Degani et al. | |
| 6,312,165 B1 * | 11/2001 | Yeandle | G02B 6/30 |
| | | | 385/88 |
| 6,661,082 B1 | 12/2003 | Granada et al. | |
| 6,825,567 B1 | 11/2004 | Wang et al. | |
| 6,921,968 B2 | 7/2005 | Chung | |
| 7,062,144 B2 * | 6/2006 | Hwang | G02B 6/423 |
| | | | 385/139 |
| 7,411,281 B2 | 8/2008 | Zhang | |
| 7,531,906 B2 | 5/2009 | Lee | |
| 7,669,320 B2 | 3/2010 | Hurwitz et al. | |
| 8,285,087 B2 * | 10/2012 | Kim | G02B 6/4214 |
| | | | 385/14 |
| 9,368,429 B2 | 6/2016 | Swan et al. | |
| 9,466,561 B2 | 10/2016 | Li | |
| 9,496,248 B2 | 11/2016 | Lee et al. | |
| 9,557,478 B2 | 1/2017 | Doerr et al. | |
| 2004/0197955 A1 | 10/2004 | Lee | |
| 2005/0280141 A1 | 12/2005 | Zhang | |
| 2006/0251360 A1 * | 11/2006 | Lu | G02B 6/43 |
| | | | 385/88 |
| 2008/0182364 A1 | 7/2008 | Zhang | |
| 2008/0283992 A1 | 11/2008 | Palaniappan et al. | |
| 2010/0133534 A1 | 6/2010 | Do et al. | |
| 2010/0327424 A1 * | 12/2010 | Braunisch | H01L 24/14 |
| | | | 257/692 |
| 2011/0024899 A1 | 2/2011 | Masumoto et al. | |
| 2011/0108716 A1 * | 5/2011 | Shiraishi | G02B 6/4249 |
| | | | 250/227.24 |
| 2012/0187578 A1 | 7/2012 | Li | |
| 2012/0267796 A1 | 10/2012 | Haba et al. | |
| 2014/0217610 A1 | 8/2014 | Jeng et al. | |
| 2014/0321803 A1 * | 10/2014 | Thacker | G02B 6/4274 |
| | | | 385/14 |
| 2017/0199328 A1 | 7/2017 | Shubin et al. | |
| 2019/0369339 A1 * | 12/2019 | Knickerbocker | G02B 6/4239 |

FOREIGN PATENT DOCUMENTS

| | | |
|---|---|---|
| WO | 2011017202 A2 | 2/2011 |
| WO | 2013062533 A1 | 5/2013 |

* cited by examiner

PHOTONICS PACKAGE WITH FACE-TO-FACE BONDING

BACKGROUND

The present invention generally relates to photonics packaging, and more specifically, to three-dimensional photonics packaging with face-to-face bonding.

A photonic integrated circuit (PIC) or an integrated optical circuit (IOC) is a device that integrates multiple (at least two) photonic functions and as such is similar to an electronic integrated circuit. The major difference between PICs and electronic ICs is that a PIC provides functions for information signals imposed on optical wavelengths typically in the visible spectrum or near infrared 750 nm-1900 nm.

SUMMARY

Embodiments of the present invention are directed to a photonic package. A non-limiting embodiment of the photonic package includes a base substrate defining an aperture, a top die and a photonic integrated circuit (PIC) die. The top die includes a body with first and second top die sections. The first top die section is connectable with the base substrate. The PIC die includes a body with first and second PIC die sections. The PIC die is disposable in the aperture such that the second PIC die section is connectable with the second top die section and the first PIC die section extends beyond the second top die section and is exposed for connection to a waveguide assembly.

Embodiments of the present invention are directed to a photonic package. A non-limiting embodiment of the photonic package includes a base substrate defining an aperture, an interposer, one or more top dies and a photonic integrated circuit (PIC) die. The interposer includes a body, an upper surface and a lower surface with first and second interposer sections. The first interposer section is connectable with the base substrate. The one or more top dies are respectively connectable with the upper surface. The PIC die includes a body with first and second PIC die sections. The PIC die is disposable in the aperture such that the second PIC die section is connectable with the second interposer section and the first PIC die section extends beyond the second interposer section and is exposed for connection to a waveguide assembly.

Embodiments of the present invention are directed to a method of assembling a photonic package. A non-limiting embodiment of the method includes forming a base substrate to define an aperture and mounting an interposer to the base substrate. The interposer includes a body, an upper surface and a lower surface with first and second interposer sections. The mounting is conducted such that the first interposer section is connected with the base substrate. The method further includes mounting one or more top dies to the upper surface and disposing a photonic integrated circuit (PIC) die in the aperture. The PIC die includes a body with first and second PIC die sections. The disposing of the PIC die in the aperture is conducted such that the second PIC die section is connected with the second interposer section and the first PIC die section extends beyond the second interposer section and is exposed for connection to a waveguide assembly.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various ele-

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, silicon photonic integration in a package typically requires the co-packaging of photonic and application-specific integrated circuit (ASIC) dies. Two or more technology nodes are often needed but it is not always clear how to most efficiently connect a PIC to a driver chip. That is, while a PIC die can manage light modulation and detection and can have some drivers and amplification features, a top die and PIC can be designed to perform multiple functions in synergy. These multiple functions include, for example, signal processing, forward equalization, digital processing, symbol management (preparation/detection), correction (forward error correction), resampling, filters, compensation, shifts. recovery (frequency/phase/clock), PIC driver functions, trans-impedance amplification (TIA), micro-electro-mechanical system (MEMS) and any other elements needed for advanced signal analysis of the light to enable functions such as high-speed communication on the PIC die or signal analysis for sensors application.

In addition, certain driver chip features can require that there be less than 400 µm between the driver chip and the PIC die as well as low impedance and capacitance in order to transfer signal speeds to the PIC die. Impedance matching improves electrical coupling efficiency but, in high-speed applications, signal losses can limit the distance that an electrical signal can reach. Correct reduction of cross-talk between links can also be required.

Turning now to an overview of the aspects of the invention, one or more embodiments of the invention address the above-described shortcomings of the prior art by providing a photonic sub package for silicon photonic packaging with chips that are disposed in a face-to-face configuration with bridging from an organic interposer. The photonic die underhangs the interposer to expose an area for waveguide attachments, such as optical fibers, polymer waveguides or coupling structures. A base substrate has a through-hole so the photonic chip can be attached near the end of the assembly process. The through-hole also provides a recess for the photonic chip. Either of the dies in the package or the interposer can be provided with a redistribution layer (RDL) that has the capability to drive current. The photonic sub package can also be used in a photonic subassembly that is testable as a subassembly and enables integration of a pre-test optical engine close to ASIC The above-described aspects of the invention address the shortcomings of the prior art by providing for a photonic sub package in which the PIC die and the driver die are close enough to one another to allow high-speed signal reach or to enable low impedance and capacitance such that signals can be transferred to the PIC die.

Figure 1:
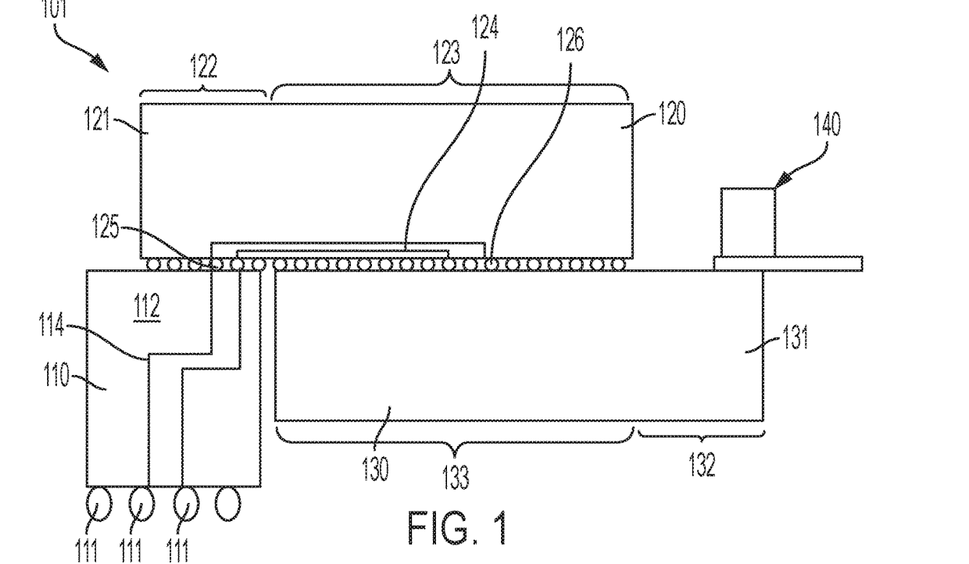
FIG. 1 is a side schematic view of a photonic package in accordance with embodiments of the present invention.

Turning now to a more detailed description of aspects of the present invention, FIG. 1, a photonic package 101 is provided and includes a base substrate 110, a top die 120 and a photonic integrated circuit (PIC) die 130. The photonic package 101 can also include a waveguide assembly 140.

The base substrate 110 can be attachable to a grid array, using (micro BGA) or land pads or any electrical bumping by way of lower connectors 111 along a lower surface thereof and includes a substrate body 112 and first traces 114 extending through the substrate body 112. The substrate body 112 of the base substrate 110 can be formed to define an aperture 115 (see FIG. 2A).

The top die 120 includes a top die body 121 with a first top die section 122 and a second top die section 123. The top die 120 can be provided with RDLs or can be provided as a fanout package. The top die 120 further includes second traces 124 as well as first top die connectors 125 and second top die connectors 126 along a lower surface of the top die body 121 at the first and second top die sections 122 and 123, respectively. The first and second top die connectors 125 and 126 are electrically communicative by way of the second traces 124. The first top die section 122 is supportable on the upper surface of the base substrate 110 such that the first traces 114 are electrically communicative with the second traces 124 by way of the first top die connectors 125.

The PIC die 130 includes a PIC die body 131 with a first PIC die section 132 and a second PIC die section 133. The PIC die 130 is disposable in the aperture 115 (see FIG. 2A) such that the second PIC die section 133 is disposable in contact with the second top die section 123 and is connectable with the second top die section 123 whereby the second traces 124 are electrically communicative with the PIC die 130 by way of the second top die connectors 126. The first PIC die section 132 extends beyond the second top die section 123 and is exposed beyond a distal edge of the top die 120 for connection to the waveguide assembly 140.

In accordance with embodiments of the present invention, the first PIC die section 132 can be configured to be available for and capable of executing sensing applications in which optical signals are processed in a transceiver or sensor fashion. In accordance with additional or alternative embodiments of the present invention, the first PIC die section 132 can be configured to be available for and capable of executing neuromorphic and/or photonic learning applications in which optical signals are manipulated based on data learning concepts.

In accordance with embodiments of the present invention, the PIC die 130 can be a silicon photonic PIC, a III-V PIC, such as indium phosphorous (InP) or gallium arsenic (GaAs), silicon nitride (SN) or can be formed of glass or organic materials, such as polymers, or any material that can transfer or process light.

With the configuration described above, the first traces 114 are electrically communicative with the top die 120 and with the PIC die 130 by way of the second traces 124. That is, the top die 120 acts as a bridge circuit between the base substrate 110 and the PIC die 130.

Figure 2A:
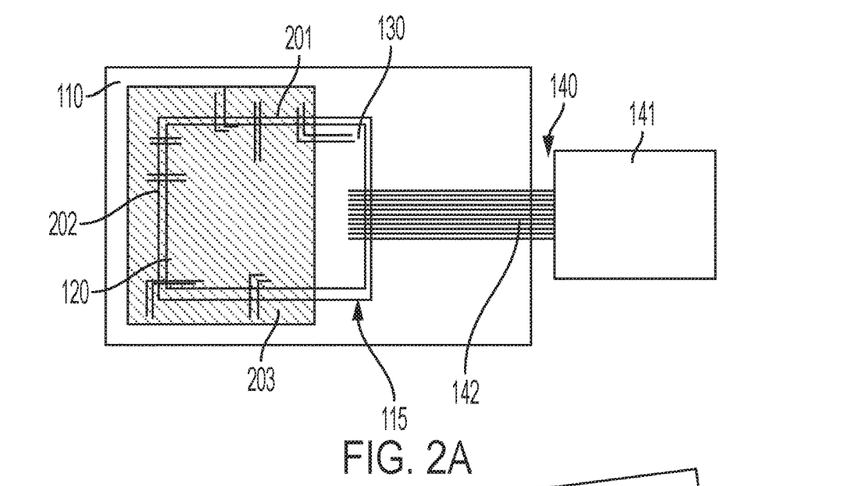
FIG. 2A is a top-down schematic view of the photonic package of FIG. 1 with a waveguide assembly in accordance with embodiments of the present invention.

With reference to FIG. 2A and in accordance with embodiments of the present invention, the first top die section 122 of the top die 120 can be supported on the base substrate 110 along one or, multiple sides 201, 202 and 203.

Figure 2B:
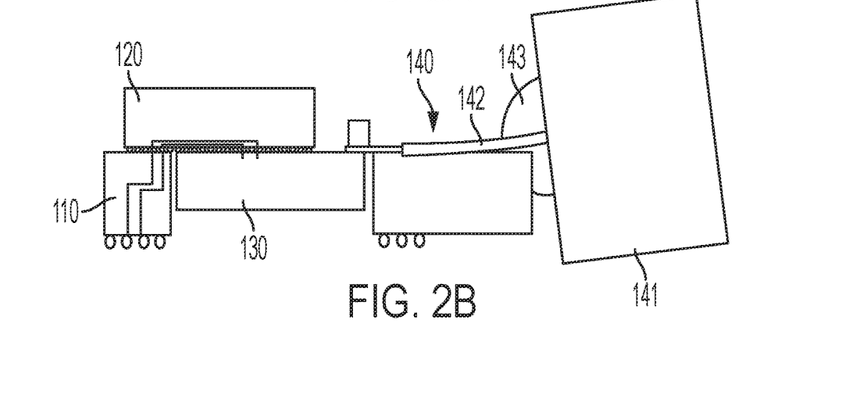
FIG. 2B is a side schematic view of the photonic package of FIG. 1 with a waveguide assembly and strain relief in accordance with embodiments of the present invention.

With continued reference to FIG. 2A and with additional reference to FIG. 2B, the waveguide assembly 140 includes a ferrule 141 and an array of optical light guiding components 142 (e.g., optical fibers, polymer waveguides, glass blocks, etc.) that are disposed and configured to optically couple the ferrule 141 with the first PIC die section 132. A strain relief element 143 can be provided to provide support for the array of optical light guiding components 142.

Figure 3:
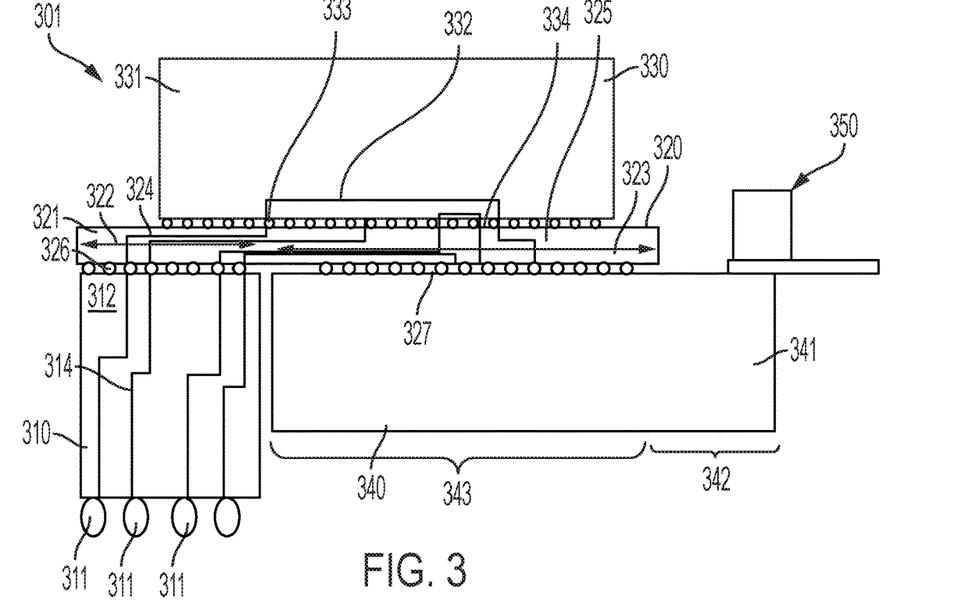
FIG. 3 is a side schematic view of a photonic package in accordance with embodiments of the present invention.

With reference to FIG. 3, a photonic package 301 is provided and includes a base substrate 310, an interposer 320, one or more top dies 330 and a PIC die 340. The photonic package 301 can also include a waveguide assembly 350.

As above, the base substrate 310 can be attachable to a grid array, using (micro BGA) or land pads or any electrical bumping, by way of lower connectors 311 along a lower surface thereof and includes a substrate body 312 and first traces 314 extending through the substrate body 312. The substrate body 312 of the base substrate 310 can be formed to define an aperture 315 (see FIG. 4A).

The interposer 320 includes an interposer body 321 with a first interposer section 322 and a second interposer section 323. The interposer 320 can further include second traces 324 and third traces 325 as well as first interposer connectors 326 and second interposer connectors 327 along a lower surface of the interposer body 321 at the first and second interposer sections 322 and 323, respectively. The first interposer section 322 is supportable on the upper surface of the base substrate 110 such that the first traces 314 are electrically communicative with the second traces 324 by way of the first interposer connectors 326.

In accordance with embodiments of the present invention, the interposer 320 can include or be formed of one or more of organic materials, silicon and glass. In addition, the interposer 320 can be provided as an ultrathin core, a coreless organic interposer or a silicon interposer. The first and second interposer connectors 326 and 327 and 333 and 334 can also have a regular or ultra-dense pitch.

Each of the one or more top dies 330 includes a top die body 331 and fourth traces 332 as well as first top die connectors 333 and second top die connectors 334 along a lower surface of the top die body 331. Each of the one or more top dies 330 is supportable on an upper surface of the interposer body 321 such that the second traces 324 are electrically communicative with the fourth traces 332 by way of the first top die connectors 333 and such that the fourth traces 332 are electrically communicative with the third traces 325 by way of the second top die connectors 334.

The PIC die 340 includes a PIC die body 341 with a first PIC die section 342 and a second PIC die section 343. The PIC die 340 is disposable in the aperture 315 (see FIG. 4A) such that the second PIC die section 343 is disposable in contact with the second interposer section 323 and is connectable with the second interposer section 323 whereby the third traces 325 are electrically communicative with the PIC die 340 by way of the second interposer connectors 327. The first PIC die section 342 extends beyond the second interposer section 323 and is exposed beyond a distal edge of the interposer 320 for connection to the waveguide assembly 350.

In accordance with embodiments of the present invention, the PIC die 340 can be a silicon photonic PIC, a III-V PIC such as InP or GaAs, SN or can be formed of glass or organic materials, such as polymers, or any material that can transfer or process light.

In accordance with embodiments of the present invention, the first PIC die section 342 can be configured to be available for and capable of executing sensing applications.

With the configuration described above, the first traces 314 of the base substrate 310 are electrically communicative with the PIC die 340 by way of the second traces 324, each of the fourth traces 332 and the third traces 325. That is, the interposer 320 and each of the one or more top dies 330 act as bridge circuitry between the base substrate 310, each of the one or more top dies 330 and the PIC die 340.

Figure 4A:
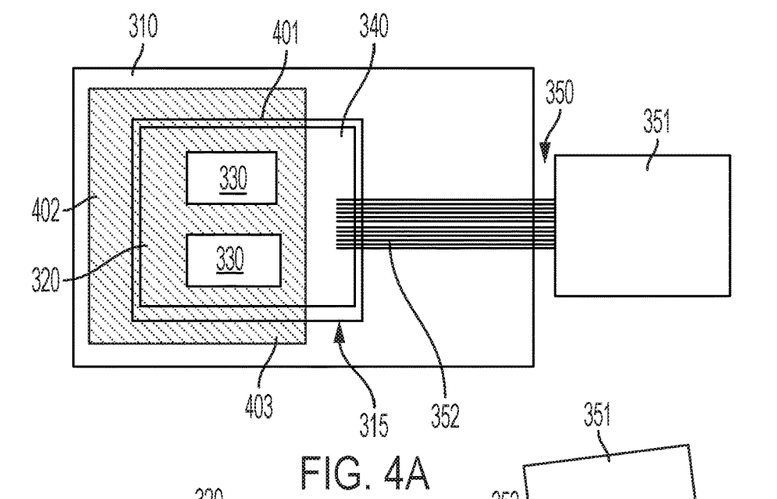
FIG. 4A is a top-down schematic view of the photonic package of FIG. 3 with a waveguide assembly in accordance with embodiments of the present invention.

With reference to FIG. 4A and in accordance with embodiments of the present invention, the first interposer section 322 of the interposer 320 can be supported on the base substrate 310 along one or multiple sides 401, 402 and 403.

Figure 4B:
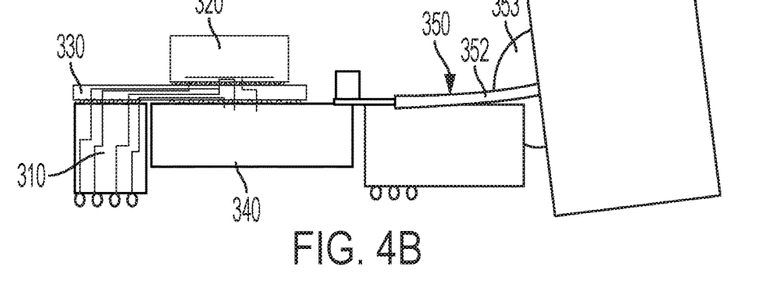
FIG. 4B is a side schematic view of the photonic package of FIG. 3 with a waveguide assembly and strain relief in accordance with embodiments of the present invention.
Figure 5A:
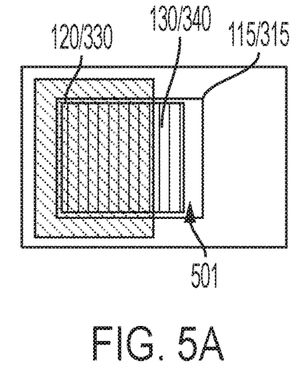
FIG. 5A is a top-down schematic view of a configuration of a base substrate in a photonic package in accordance with embodiments of the present invention.
Figure 5B:
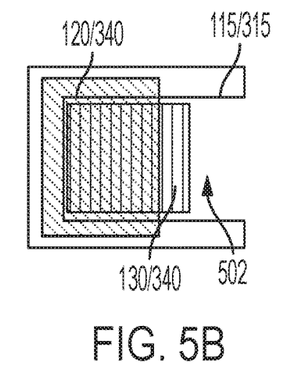
FIG. 5B is a top-down schematic view of a configuration of a base substrate in a photonic package in accordance with embodiments of the present invention.
Figure 5C:
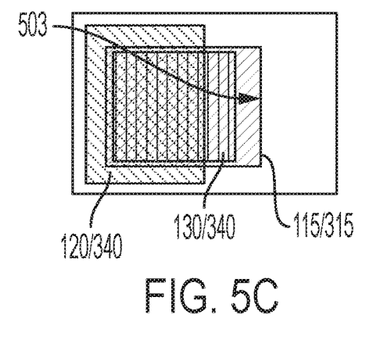
FIG. 5C is a top-down schematic view of a configuration of a base substrate in a photonic package in accordance with embodiments of the present invention.
Figure 5D:
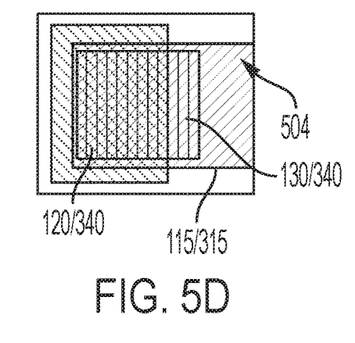
FIG. 5D is a top-down schematic view of a configuration of a base substrate in a photonic package in accordance with embodiments of the present invention.
Figure 5E:
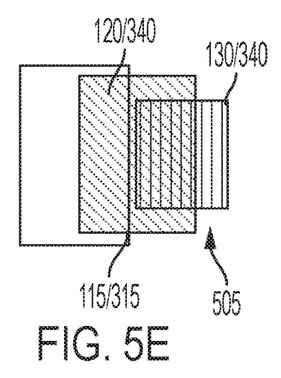
FIG. 5E is a top-down schematic view of a configuration of a base substrate in a photonic package in accordance with embodiments of the present invention.

With continued reference to FIG. 4A and with additional reference to FIG. 4B, the waveguide assembly 350 includes a ferrule 351 and an array of optical light guiding components 352 (e.g., optical fibers, polymer waveguides, glass blocks, etc.) that are disposed and configured to optically couple the ferrule 351 with the first PIC die section 342. A strain relief element 353 can be provided to provide support for the array of optical light guiding components 352.

With reference to FIGS. 5A-5E, the base substrate 110 of the embodiments of FIGS. 1, 2A and 2B and the base substrate 310 of the embodiments of FIGS. 3, 4A and 4B can be formed to define the aperture 115/315 as one of an open through-hole 501 (see FIG. 5A) in which the base substrate 110/310 has no floor, an open slot 502 (see FIG. 5B) in which the base substrate 110/310 has no floor or full surrounding walls, a cavity 503 (see FIG. 5C) in which the base substrate 110/310 has a floor over which the PIC die 130/340 is disposable, a closed slot 504 (see FIG. 5D) in which the base substrate 110/310 has a floor over which the PIC die 130/340 is disposable and a complete opening 505 (see FIG. 5E) in which the top die 120 or the interposer 320 overhangs proximal sides of the base substrate 110/310 and the PIC die 130/340.

Figure 6:
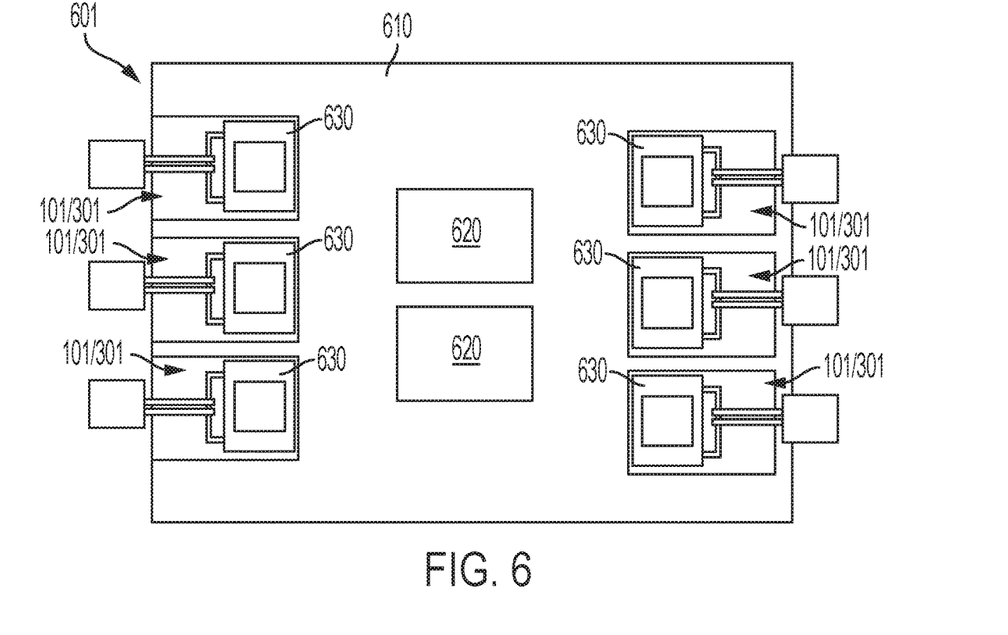
FIG. 6 is a top-down schematic view of a switch application including photonic packages in accordance with embodiments of the present invention.

With reference to FIG. 6, a switch application 601 is provided and includes a switch application substrate 610, one or more ASICs 620 respectively supported on the switch application substrate 610 and one or more photonic packages 630. Each of the one or more photonic packages 630 can be configured as the photonic package 101 of the embodiments of FIGS. 1, 2A and 2B or as the photonic package 301 of the embodiments of FIGS. 3, 4A and 4B. In any case, each photonic package 630 is respectively supported on the switch application substrate 610 proximate to and in communication with the one or more ASICs 620. The photonic package 630 can be soldered or socket mounted on the switch application substrate 610 in either the top or bottom of the switch application substrate 610. Additional electrical connectors can be used to feed the photonic engine undependably of an ASIC prime power source (not shown).

Figure 7:
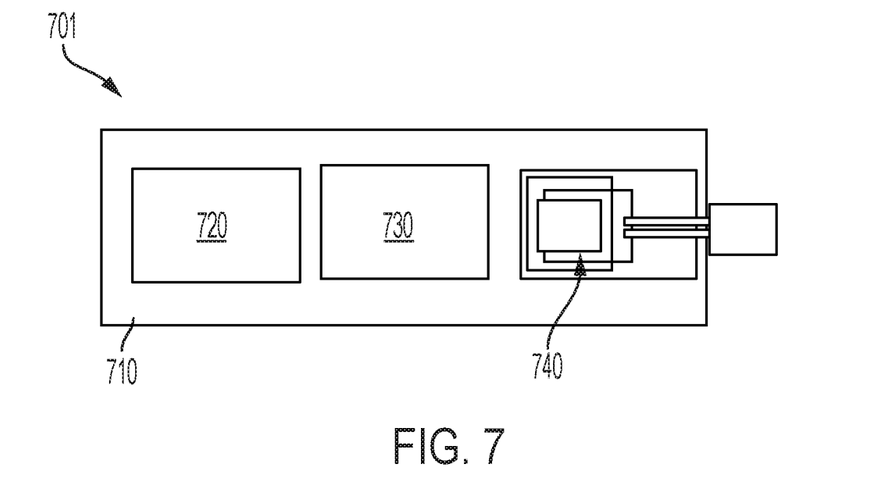
FIG. 7 is a top-down schematic view of an interconnect interface for a data accelerator including a photonic package in accordance with embodiments of the present invention.

With reference to FIG. 7, an interconnect interface 701 is provided for use with a data accelerator, for example, and includes an interface substrate 710, a memory die 720 that is supported on the interface substrate 710, an ASIC 730 that is supported on the interface substrate 710 and a photonic package 740. The photonic package 740 can be configured as the photonic package 101 of the embodiments of FIGS. 1, 2A and 2B or as the photonic package 301 of the embodiments of FIGS. 3, 4A and 4B. In any case, the photonic package 740 is supported on the interface substrate 710 proximate to and in communication with the memory die 720 and the ASIC 730.

Figure 8:
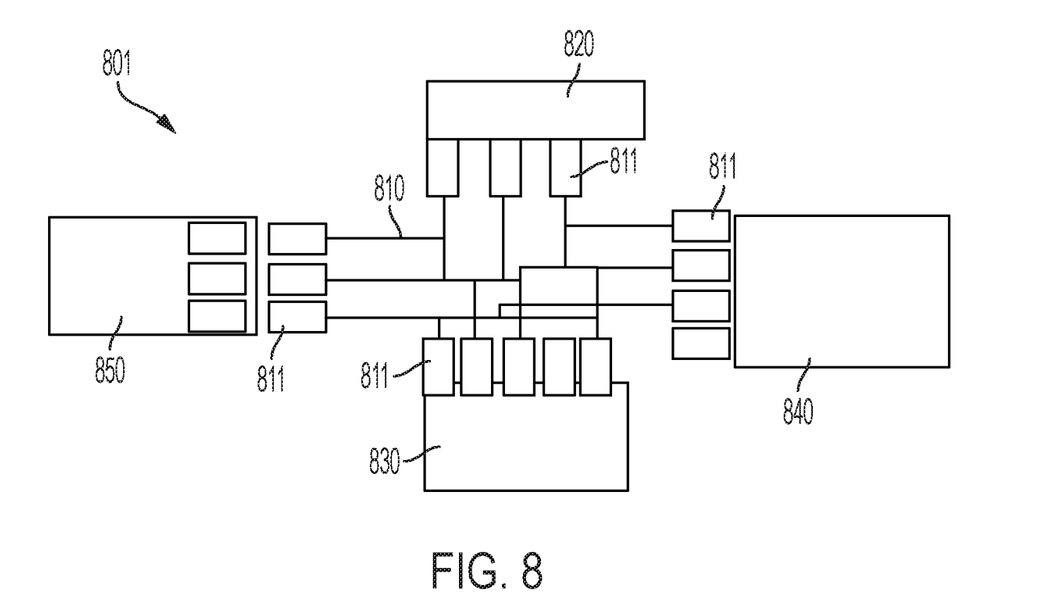
FIG. 8 is a top-down schematic view of high-bandwidth optical links of a system via photonic packages in accordance with embodiments of the present invention.

With reference to FIG. 8, a system 801 is provided in which multiple components are optically connected to one another via high-bandwidth optical links 810. The multiple components each include one or more photonic packages 811 that optically communicate with one another to form the high-bandwidth optical links 810. Each of the one or more photonic packages 811 of each of the multiple components can be configured as the photonic package 101 of the embodiments of FIGS. 1, 2A and 2B or as the photonic package 301 of the embodiments of FIGS. 3, 4A and 4B. In an exemplary case, the multiple components can include, but are not limited to, a central processing unit 820, memory and storage blocks 830 and 840 and an accelerator 850.

Figure 9:
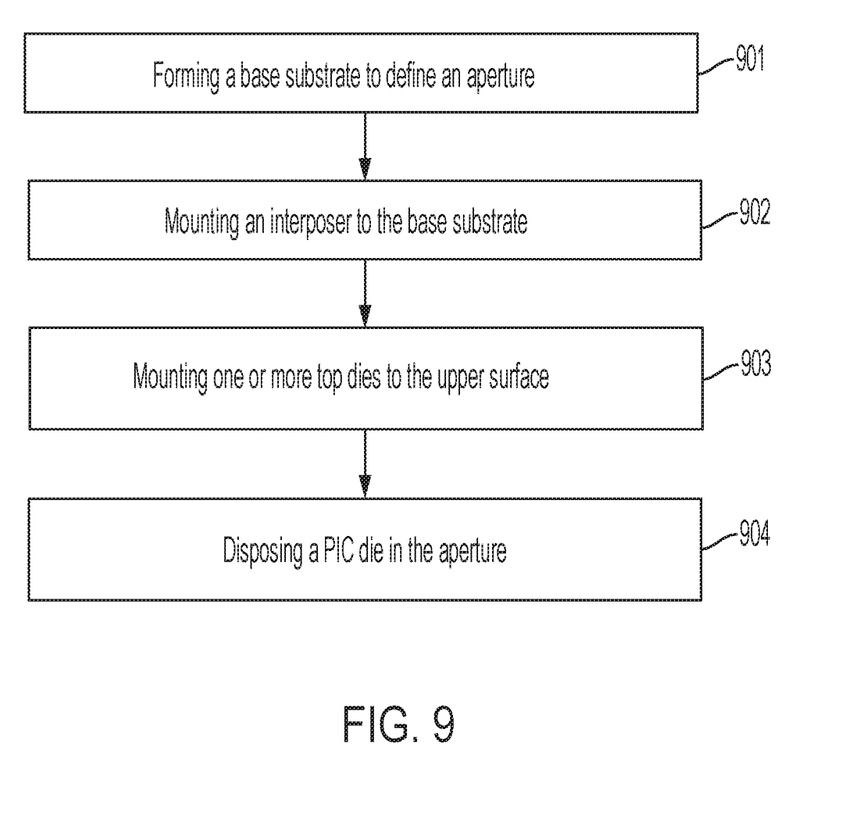
FIG. 9 is a flow diagram illustrating a method of assembling a photonic package in accordance with embodiments of the present invention.

With reference to FIG. 9, a method of assembling a photonic package is provided. As shown in FIG. 9, the method includes forming a base substrate to define an aperture 901 as one of a through-hole, a slot and a cavity and mounting an interposer to the base substrate 902 along one or multiple sides of the interposer. The interposer includes a body, an upper surface and a lower surface with first and second interposer sections and the mounting is conducted such that the first interposer section is connected with the base substrate. The method further includes mounting one or more top dies to the upper surface 903 and disposing a PIC die in the aperture 904. The PIC die includes a body with first and second PIC die sections. The disposing of the PIC die in the aperture is conducted such that the second PIC die section is connected with the second interposer section and the first PIC die section extends beyond the second interposer section and is exposed for connection to a waveguide assembly.

The exposed optical region allows the optical connection of optical components and strain relief features to create an optical coupling between the waveguides on the PIC and the optical components, such as fiber optics, polymer waveguides or lenses. In accordance with embodiments of the present invention, the exposed region of the PIC die can include a sensor portion that uses light interaction in the extension beyond the interposer section and is used for sensing environmental applications.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list or more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A photonic package, comprising:
   a waveguide assembly;
   a base substrate defining an aperture;
   a top die comprising a body with first and second top die sections, the first top die section being connectable with the base substrate; and
   a photonic integrated circuit (PIC) die comprising a body with first and second PIC die sections, the PIC die being disposable in the aperture such that the second PIC die section is connectable with the second top die section and the first PIC die section extends beyond the second top die section and is exposed for connection to the waveguide assembly,
   wherein the waveguide assembly comprises a ferrule and optical light guiding components comprising:
   first ends optically coupled with the PIC die which extend along the first PIC die section and a corresponding section of the base substrate and across a corresponding section of the aperture; and
   second ends optically coupled with the ferrule which curve away and apart from the corresponding section of the base substrate, and
   wherein the ferrule is disposed beyond a distal edge of the base substrate and is tilted with respect to the base substrate with a lowermost corner disposed below a lowermost surface of the base substrate.

2. The photonic package according to claim 1, wherein the base substrate is formed to define the aperture as one of a through-hole, a slot and a cavity.

3. The photonic package according to claim 1, wherein:
   the base substrate comprises three sides formed to define the aperture as an open slot in which the PIC die is insertible, and
   the first top die section extends along each of the three sides of the base substrate.

4. The photonic package according to claim 1, wherein the top die comprises circuit traces extending through an interior of the top die by which the base substrate and the PIC die are electrically communicative.

5. The photonic package according to claim 1, wherein:
   the first ends extend substantially in parallel with an upper surface of the corresponding section of the base substrate and the second ends curve upwardly away and apart from the upper surface, and
   the waveguide assembly further comprises a strain relief element partially interposed between the corresponding section of the base substrate and the ferrule to support and surround the second ends of the optical light guiding components while contacting opposed surfaces of the base substrate and the ferrule.

6. The photonic package according to claim 1, wherein the PIC die is configured to process or manipulate optical signals.

7. A switch application, comprising:
a substrate;
one or more application specific integrated circuits (ASICs) respectively supported on the substrate; and
one or more photonic packages according to claim 1 respectively supported on the substrate proximate to and in communication with the one or more ASICs.

8. An interconnect interface for a data accelerator, comprising:
a substrate;
a memory die supported on the substrate;
an application specific integrated circuit (ASIC) supported on the substrate; and
a photonic package according to claim 1 supported on the substrate proximate to and in communication with the memory die and the ASIC.

9. A photonic package, comprising:
a waveguide assembly;
a base substrate defining an aperture;
an interposer comprising a body, an upper surface and a lower surface with first and second interposer sections, the first interposer section being connectable with the base substrate;
one or more top dies respectively connectable with the upper surface; and
a photonic integrated circuit (PIC) die comprising a body with first and second PIC die sections, the PIC die being disposable in the aperture such that the second PIC die section is connectable with the second interposer section and the first PIC die section extends beyond the second interposer section and is exposed for connection to the waveguide assembly,
wherein the waveguide assembly comprises a ferrule and an array of optical light guiding components comprising:
first ends optically coupled with the PIC die which extend along the first PIC die section and a corresponding section of the base substrate and across a corresponding section of the aperture; and
second ends optically coupled with the ferrule which curve away and apart from the corresponding section of the base substrate, and
wherein the ferrule is disposed beyond a distal edge of the base substrate and is tilted with respect to the base substrate with a lowermost corner disposed below a lowermost surface of the base substrate.

10. The photonic package according to claim 9, wherein the base substrate is formed to define the aperture as one of a through-hole, a slot and a cavity.

11. The photonic package according to claim 9, wherein the interposer comprises one or more of organic materials, silicon and glass.

12. The photonic package according to claim 9, wherein:
the base substrate comprises three sides formed to define the aperture as an open slot in which the PIC die is insertible, and
the first interposer section extends along each of the three sides of the base substrate.

13. The photonic package according to claim 9, wherein the interposer comprises:

first circuit traces by which the base substrate and the top die are electrically communicative;
second circuit traces by which the top die and the PIC die are electrically communicative; and
additional circuit traces that extend through an interior of the interposer by which the base substrate and the PIC die are directly electrically communicative.

14. The photonic package according to claim 9, wherein:
the first ends extend substantially in parallel with an upper surface of the corresponding section of the base substrate and the second ends curve upwardly away and apart from the upper surface, and
the waveguide assembly further comprises a strain relief element partially interposed between the corresponding section of the base substrate and the ferrule to support and surround the second ends of the array of optical light guiding components optically coupled with the first PIC die section while contacting opposed surfaces of the base substrate and the ferrule.

15. The photonic package according to claim 9, wherein the PIC die is configured to process or manipulate optical signals.

16. A switch application, comprising:
a substrate;
one or more application specific integrated circuits (ASICs) respectively supported on the substrate; and
one or more photonic packages according to claim 9 respectively supported on the substrate proximate to and in communication with the one or more ASICs.

17. An interconnect interface for a data accelerator, comprising:
a substrate;
a memory die supported on the substrate;
an application specific integrated circuit (ASIC) supported on the substrate; and
a photonic package according to claim 9 supported on the substrate proximate to and in communication with the memory die and the ASIC.

18. A method of assembling a photonic package, the method comprising:
forming a base substrate to define an aperture therein;
mounting an interposer to the base substrate, the interposer comprising a body, an upper surface and a lower surface with first and second interposer sections and the mounting being conducted such that the first interposer section is connected with the base substrate;
mounting one or more top dies to the upper surface; and
disposing a photonic integrated circuit (PIC) die in the aperture, the PIC die comprising a body with first and second PIC die sections, the disposing of the PIC die in the aperture being conducted such that the second PIC die section is connected with the second interposer section and the first PIC die section extends beyond the second interposer section and is exposed for connection to a waveguide assembly,
wherein the waveguide assembly comprises a ferrule, which is tilted with respect to the base substrate, and an array of optical light guiding components comprising first ends and second ends and the method further comprises:
optically coupling the first ends with the PIC die and disposing the first ends to extend along the first PIC die section and a corresponding section of the base substrate and across a corresponding section of the aperture; and optically coupling the second ends with the ferrule and disposing the second ends to curve away and apart from the corresponding section of the base substrate, and wherein the ferrule is disposed beyond a distal edge of the base substrate and is tilted with respect to the base substrate with a lowermost corner disposed below a lowermost surface of the base substrate.

19. The method according to claim 18, wherein:

the forming comprises forming the base substrate with three sides to define the aperture as an open slot, and the mounting of the interposer comprises mounting the first interposer section along each of the three sides of the base substrate.

* * * * *